US011009800B2

(12) United States Patent
Nienhuys et al.

(10) Patent No.: US 11,009,800 B2
(45) Date of Patent: May 18, 2021

(54) MEASUREMENT SYSTEM, LITHOGRAPHIC APPARATUS AND DEVICE MANUFACTURING METHOD

(71) Applicant: ASML NETHERLANDS B.V., Veldhoven (NL)

(72) Inventors: Han-Kwang Nienhuys, Utrecht (NL); Güneş Nakiboğlu, Eindhoven (NL); Rita Marguerite Albin Lambertine Petit, Eindhoven (NL); Hermen Folken Pen, Vught (NL); Remco Yuri Van De Moesdijk, Geldrop (NL); Frank Johannes Jacobus Van Boxtel, Eindhoven (NL); Borgert Kruizinga, Zoetermeer (NL)

(73) Assignee: ASML Netherlands B.V., Veldhoven (NL)

( * ) Notice: Subject to any disclaimer, the term of this patent is extended or adjusted under 35 U.S.C. 154(b) by 326 days.

(21) Appl. No.: 16/071,380

(22) PCT Filed: Jan. 26, 2017

(86) PCT No.: PCT/EP2017/051603
§ 371 (c)(1),
(2) Date: Jul. 19, 2018

(87) PCT Pub. No.: WO2017/153085
PCT Pub. Date: Sep. 14, 2017

(65) Prior Publication Data
US 2020/0379360 A1    Dec. 3, 2020

(30) Foreign Application Priority Data
Mar. 10, 2016   (EP) .................................... 16159723

(51) Int. Cl.
*G03F 7/20* (2006.01)
*G03F 1/84* (2012.01)

(52) U.S. Cl.
CPC ............ *G03F 7/70783* (2013.01); *G03F 1/84* (2013.01); *G03F 7/7085* (2013.01); *G03F 7/70875* (2013.01)

(58) Field of Classification Search
CPC ............ G03F 7/70266; G03F 7/70875; G03F 7/70891; G03F 1/72; G03F 7/20;
(Continued)

(56) References Cited

U.S. PATENT DOCUMENTS

2003/0003383 A1   1/2003  Van Der Werf et al.
2005/0140949 A1   6/2005  Jasper et al.
(Continued)

FOREIGN PATENT DOCUMENTS

CN        1591195       3/2005
CN      101910951      12/2010
(Continued)

OTHER PUBLICATIONS

Japanese Office Action issued in corresponding Japanese Patent Application No. 2018-536828, dated Aug. 30, 2019.
(Continued)

*Primary Examiner* — Mesfin T Asfaw
(74) *Attorney, Agent, or Firm* — Pillsbury Winthrop Shaw Pittman LLP

(57) ABSTRACT

A measurement system to determine a deformation of an object having a front surface, a back surface and a pattern. The measurement system includes a processor system and an interferometer system. The interferometer system has a radiation source and a detector system. The source is configured to emit, to each of a plurality of locations on the object, measurement beams in order to generate, at each of
(Continued)

the respective plurality of locations, reflected measurement beams off the front and back surfaces of the object respectively. The detector system is configured to receive the respective reflected measurement beams and output signals representative of the received reflected measurement beams to the processor system. The processor system is configured to receive the signals; determine, based on the signals as received, a characteristic of the object; and determine a deformation of the pattern based on the characteristic.

20 Claims, 7 Drawing Sheets

(58) Field of Classification Search
CPC ............... G03F 7/7065; G03F 7/70725; G03F 7/70783; G03F 30/17; G03F 30/398; G03F 7/70633; G03F 7/70608; G03F 7/70625; G03F 7/705; G03F 9/7046; G03F 7/70258; G03F 7/70616; G03F 7/70308; G03F 17/5009; G03F 30/20; G03F 7/70441; G03F 7/70641; G03F 7/7085; G03F 1/84; B29C 64/393; B29C 67/0088; G05B 19/4099; B22F 3/1055; H01L 22/12
See application file for complete search history.

(56) References Cited

U.S. PATENT DOCUMENTS

| | | |
|---|---|---|
| 2005/0140950 A1 | 6/2005 | Franken et al. |
| 2005/0259716 A1 | 11/2005 | Ito et al. |
| 2007/0069152 A1 | 3/2007 | Lee et al. |
| 2010/0141913 A1 | 6/2010 | Morimoto |
| 2010/0284015 A1 | 11/2010 | Sewell |
| 2012/0099089 A1 | 4/2012 | Sogard |
| 2012/0133914 A1 | 5/2012 | Prosyentsov et al. |
| 2014/0340663 A1 | 11/2014 | Scaccabarozzi et al. |
| 2015/0176974 A1 | 6/2015 | Matsudo et al. |
| 2015/0212425 A1 | 7/2015 | Chieda et al. |
| 2015/0221535 A1 | 8/2015 | Nguyen et al. |

FOREIGN PATENT DOCUMENTS

| | | |
|---|---|---|
| CN | 102445284 | 5/2012 |
| JP | H0774075 | 3/1995 |
| JP | 2003307458 | 10/2003 |
| JP | 2006126082 | 5/2006 |
| JP | 2011060799 | 3/2011 |
| JP | 2012078179 | 4/2012 |
| TW | 201531677 | 8/2015 |
| TW | 201546576 | 12/2015 |

OTHER PUBLICATIONS

Chinese Office Action issued in corresponding Chinese Patent Application No. 2017800139196, dated Nov. 28, 2019.

Chinese Office Action issued in corresponding Chinese Patent Application No. 201780013919.6, dated Jun. 30, 2020.

International Search Report and Written Opinion issued in corresponding PCT Application No. PCT/EP2017/051603, dated Jun. 12, 2017, 10 pages.

MEASUREMENT SYSTEM, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2017/051603, which was filed on Jan. 26, 2017, which claims the benefit of priority of European patent application no. 16159723.2, which was filed on Mar. 10, 2016, and which is incorporated herein in its entirety by reference.

BACKGROUND

Field of the Invention

The present invention relates to a measurement system, a lithographic apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to ensure proper operation of the integrated circuit, it is important that the different patterns that are consecutively applied have an accurate match. In order to ensure such a match, care is taken that the substrate is properly positioned, both in the horizontal plane and in vertical direction, relative to the image plane of the pattern. A possible mismatch between an imaged pattern and previously applied pattern may, however, also be caused by a deformation of the pattern. Such a deformation may e.g. be caused by mechanical stresses or by thermal effects such as a non-uniform temperature distribution. When known, these effects may at least partly be compensated, e.g. by adjusting the projection system of the lithographic apparatus. At present, means to assess such a deformation of the pattern are rather limited. In a known arrangement, a temperature of a top surface of a patterning device is determined, e.g. at various locations on the patterning device, by means of IR temperature sensors, the temperature measurements subsequently being used to determine a deformation of the patterning device.

SUMMARY

It is desirable to provide in a more accurate assessment of a deformation of a pattern on a patterning device. Therefore, according to an embodiment of the present invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a positioning device configured to position the support relative to the substrate table; and a projection system configured to project the patterned radiation beam onto a target portion of the substrate, wherein the apparatus further comprises a measurement system configured to determine a deformation of the pattern of the patterning device, the measurement system comprising:

a processing system and an interferometer system comprising a light source and a detector system; the light source being configured to emit, to each of a plurality of locations on the patterning device, one or more measurement beams in order to generate, at each of the respective plurality of locations, a reflected measurement beam off a front surface of the patterning device and a reflected measurement beam off a back surface of the patterning device; the detector system being configured to receive, for each of the plurality of locations, the respective reflected measurement beams and output one or more signals representative of the received reflected measurement beams to the processing system;

wherein the processing system is configured to:

receive, for each of the plurality of locations, the one or more signals;

determine, based on the plurality of one or more signals as received, a physical characteristic of the patterning device, the physical characteristic being representative of a deformation of the patterning device; and, determine, based on the physical characteristic of the patterning device and a mathematical model of the patterning device, a deformation of the pattern, wherein the physical characteristic is a temperature or a temperature offset at the plurality of locations.

According to another aspect of the present invention, there is provided a measurement system configured to determine a deformation of an object having a front surface and a back surface and being provided with a pattern, the measurement system comprising:

a processing system and an interferometer system comprising a light source and a detector system; the light source being configured to emit, to each of a plurality of locations on the object, one or more measurement beams in order to generate, at each of the respective plurality of locations, a reflected measurement beam off the front surface of the object and a reflected measurement beam off the back surface of the object; the detector system being configured to receive, for each of the plurality of locations, the respective reflected measurement beams and output one or more signals representative of the received reflected measurement beams to the processing system;

wherein the processing system is configured to:
receive, for each of the plurality of locations, the one or more signals;
determine, based on the plurality of one or more signals as received, a physical characteristic of the object, the physical characteristic being representative of a deformation of the object; and,
determine, based on the physical characteristic of the object and a mathematical model of the object, a deformation of the pattern, wherein the physical characteristic is a temperature or a temperature offset at the plurality of locations.

The object may be a patterning device, the pattern being included in the patterning device and the patterning device being capable of imparting a radiation beam with a pattern in its cross-section to form a patterned radiation beam. The deformation may include an in-plane deformation of the pattern.

According to an embodiment of the invention, there is provided a device manufacturing method comprising transferring a pattern from a patterning device onto a substrate using a lithographic apparatus according to the present invention.

The step of transferring the pattern may include controlling a position of the substrate table relative to the support based on the deformation of the pattern. The positioning device may be configured to control the position of the substrate table relative to the support by means of a set point provided to a controller of the positioning device, the set point being based on the deformation of the pattern.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
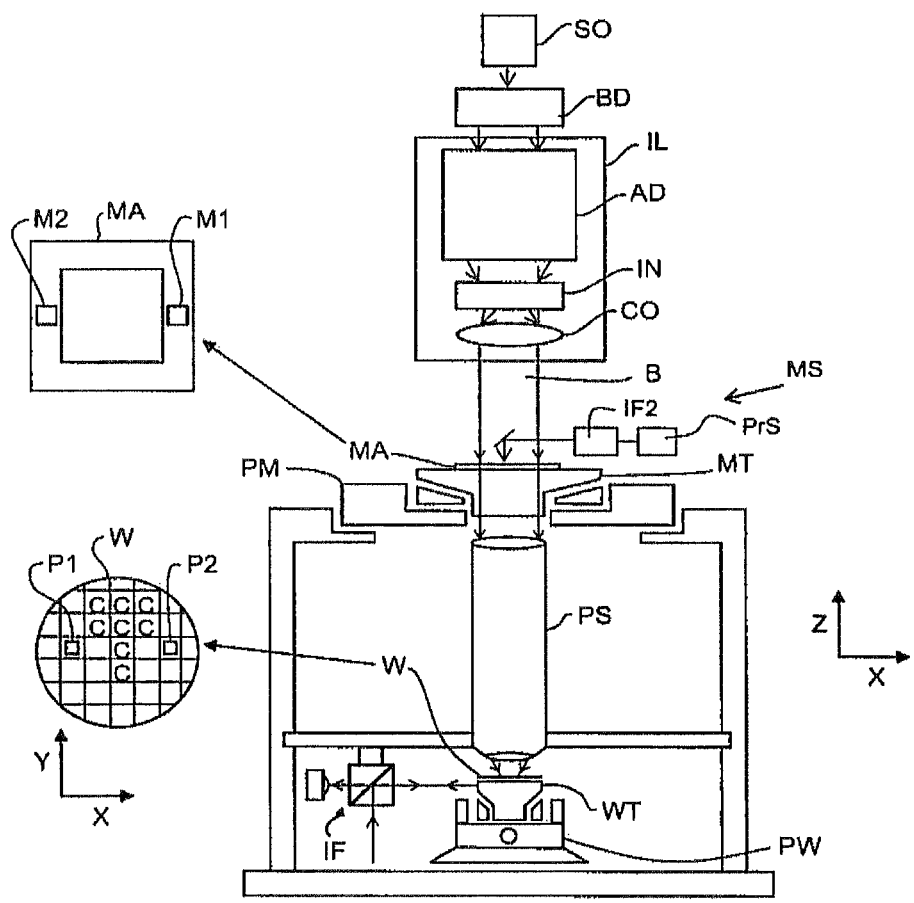
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels, Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM, Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
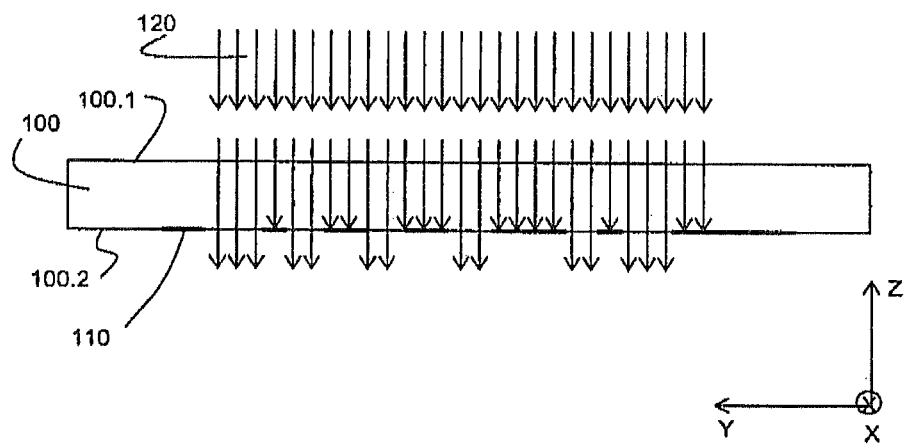
FIG. 2 depicts a patterning device as can be applied in a lithographic apparatus according to the present invention.

The lithographic apparatus as schematically shown in FIG. 1 further comprises a measurement system MS according to an embodiment of the present invention. The measurement system MS comprises an interferometer system IF2 and a processing system PrS. In accordance with the present invention, the measurement system MS is configured to determine a deformation of a pattern that is present on the patterning device or mask MA, as will be explained in more detail below, FIG. 2 schematically depicts a patterning device 100 having a front surface 100.1 and a back surface 100.2. On the back surface 100.2, a pattern 110 is provided. Typically, this is a two-dimensional pattern, extending in the XY-plane (the X-direction being perpendicular to the YZ-plane of the FIG. 2), that is to be projected accurately onto a substrate, thereby maintaining a predetermined positional relationship with a pattern that is previously applied to the substrate. Such a patterning device 100 may e.g. be applied in a lithographic apparatus as shown in FIG. 1. During use, a conditioned beam of radiation 120, e.g. DUV radiation, may be projected onto the patterning device 100. The patterning device 100 is typically made of SiO2 or fused silica, which is transparent for the DUV radiation beam 120. Typically, the pattern 110 as applied to the back surface 100.2 of the patterning device 100 may be a chromium layer. The patterned chromium layer is not transparent for the DUV radiation 120, rather, the DUV radiation 120 is substantially absorbed by the chromium layer. The absorbed radiation may be converted to heat, increasing the temperature of the chromium layer, e.g. from an environmental temperature of 22° C. to 26° C. this elevated temperature of the chromium layer 120 may then heat the patterning device 100, by means of heat conduction. As a result of this heating, the patterning device 100, including the pattern 120, may deform. Within the meaning of the present invention, a deformation of the object may refer to a displacement of a point or location on the object relative to a nominal position. A point or location on the object may e.g. have a nominal position with coordinates (x,y,z) and, due the heating, displace to a position (x+Δx, y+Δy, z+Δz). As such, the deformation of the object at position (x,y,z) may be characterized by a displacement vector (Δx, Δy, Δz). Due to the heating of the patterning device 100, which may typically be non-uniform, various types of deformations may occur. As a first example of such deformations, in-plane deformations of the pattern 110 can be mentioned, in-plane deformations being deformations observable in the XY-plane, i.e. parallel to the plane of the pattern 110. Such an in-plane deformation may thus be characterized by considering the X- and Y-components of the displacement vector (Δx, Δy, Δz) of different positions of the pattern.

In general, when an object is heated, out-of-plane deformations may also occur. Within the meaning of the present invention, such out-of-plane deformations may e.g. be characterized by considering the Z-component of the displacement vector (Δx, Δy, Δz).

As explained above, the heating of the patterning device can, to a large extent, be attributed to the heating of the pattern 110, which is located on the back surface 100.2 of the patterning device 100. Because the pattern 110, as a kind of heat source, is thus located on an outer surface 100.2 of the patterning device 100, the temperature distribution may also have a non-uniformity in the Z-direction, i.e. the temperature on the front surface 100.1 may differ from the temperature at the back surface 100.2. Due to this non-uniformity, the patterning device 100 may e.g. bend. Such a bending of the patterning device, in particular of the pattern, may also be characterized as an out-of-plane deformation of the pattern.

When a deformation of a pattern occurs and no measures are taken, the projection of the pattern onto the substrate, i.e. on the target portions such as target portions C shown in FIG. 1, may be inaccurate. In particular, in-plane deformations of the pattern may cause an alignment error between the projected pattern and a previously applied pattern on the substrate, whereas out-of-plane deformations may cause the image of the pattern to be out of focus, i.e. somewhat blurred, during exposure.

In case a deformation of a pattern occurs and is known, i.e. quantified to some degree, measures may be taken to improve the exposure or projection of the pattern onto the substrate. Such measures may e.g. include adjusting a setting of the illumination system, e.g. illuminator IL as shown in FIG. 1, or the projection system, e.g. projection system PS as shown in FIG. 1, of the exposure apparatus. Alternatively, or in addition, a relative position of the pattering device and the substrate may be controlled based on the deformation of the pattern as determined. In particular, in an embodiment, the lithographic apparatus according to the present invention may comprise a positioning device, such as positioning device PW or PM or a combination thereof, controlling a position of the substrate table relative to the support based on the deformation of the pattern, e.g. based on an in-plane deformation of the pattern. In such embodiment, the positioning device may e.g. be configured to control the position of the substrate table relative to the support by means of a set point. Such a set point may e.g. be provided to a controller or control system of the positioning device, the set point being based on the deformation of the pattern.

With respect to the possible deformations as described, it is worth mentioning that similar considerations may be applied in case reflective patterning devices are used, as e.g. done in lithographic apparatuses using an EUV light source. Such patterning devices may e.g. be provided with a pattern on a front surface of the patterning device, the pattern reflecting the conditioned EUV radiation. In such arrangement, portions of the pattering device that are not provided with a pattern and which are subjected to the EUV radiation may absorb this radiation and heat up, causing a non-uniform temperature distribution.

With respect to the position of the pattern, it may also be noted that the patterning device may also be provided with a cover layer e.g. covering the pattern. In such case, the pattern is thus neither provided on the front surface, nor on the back surface.

Figure 3:
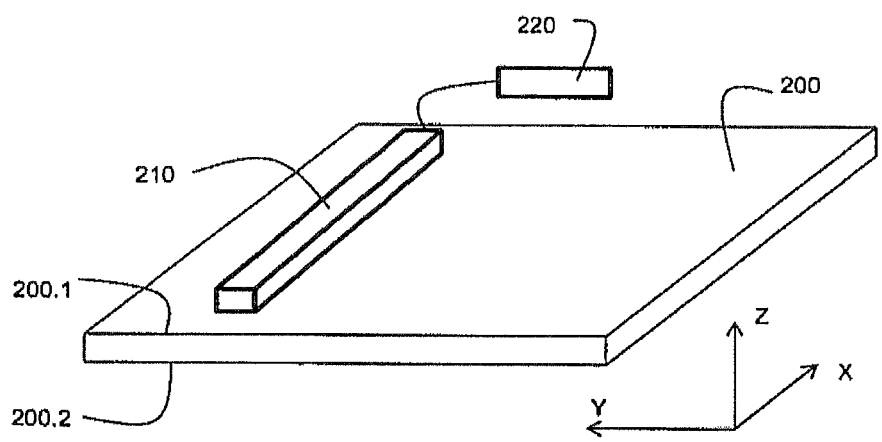
FIG. 3 schematically depicts an array of IR temperature sensors for determining a temperature profile of a patterning device.

It has been proposed to assess the temperature distribution of a patterning device by using temperature sensors. Such an arrangement is schematically shown in FIG. 3. FIG. 3 schematically shows a patterning device 200 having a front surface 200.1 and a back surface 200.2 and an array 210 of infrared (IR) temperature sensors arranged to assess a temperature of the patterning device 200 by measuring infrared radiation emanating from the patterning device 200. As shown, the array 210 of sensors extends in the X-direction and may e.g. comprise a plurality of temperature sensors arranged adjacent each other in the X-direction. The radiation as measured by the array 210 of temperature sensors may e.g. be provided to a processing unit 220; to determine the temperature of the patterning device 200. By displacing the patterning device 200 relative to the array of sensors in the Y-direction, a two-dimensional temperature profile of the pattering device, i.e. a temperature profile in the XY-plane, may be established. This temperature profile may then be used, e.g. by means of a thermo-mechanical model of the patterning device, to estimate a deformation of the patterning device.

The known arrangement of determining a temperature profile has several drawbacks. The arrangement as shown in FIG. 3 essentially captures IR radiation that originates from the front surface 200.1 of the patterning device 200, typically the surface that is not provided with the pattern that is to be projected. As indicated above, there may be a difference between the temperature of the front surface and the temperature of the back surface, due to the heating of the pattern on the bottom surface. The temperature of the front surface 200.1 may thus be a poor representation of the actual temperature of the back surface 200.2 while the thermal expansion of the back surface 200.2 may be considered to cause the deformation of the pattern on the back surface 200.2. It may also be worth mentioning that an assessment of the temperature of the top surface 200.1 does not provide any insight in the average temperature along the Z-direction or a temperature gradient in the Z-direction. As such, the possibilities to determine a deformation of the pattern on a pattering device using an array of infrared temperature sensors is rather limited.

The present invention therefore proposes a more direct approach which enables a more accurate assessment of the deformation of a pattern provided on a patterning device. In particular, in the present invention, a measurement system is proposed that is configured to determine a physical characteristic of a patterning device, whereby the physical characteristic represents of a deformation of the patterning device. In the present invention, use is made of an interferometer or interferometer system to measure a thickness or height of a patterning device or an optical path length of a measurement beam through the patterning device. Such a measured height or optical path length may be readily be applied in a mathematical model, as a representation of a deformation of the patterning device, to determine a deformation of a pattern of the patterning device. Alternatively or in addition, the measured height or optical path length may be applied to determine a temperature of the patterning device, in particular an average temperature along the height or along the optical path length as determined. The average temperature along the height of the pattering device may enable a more accurate assessment of the temperature of the back surface and may thus enable a more accurate determination of the deformation of the pattern.

Figure 4:
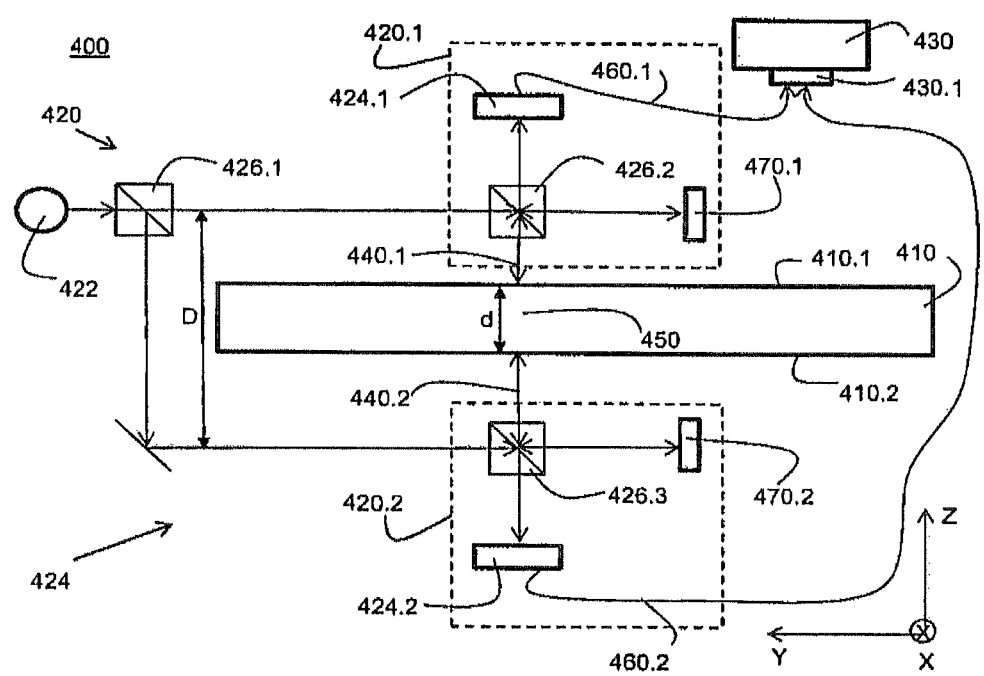
FIG. 4 schematically depicts a first embodiment of a measurement system according to the present invention.

In FIG. 4, a first embodiment of a measurement system 400 according to the present invention is schematically shown, the measurement system 400 enabling to determine a deformation of a pattern on a patterning device. In accordance with the present invention, the measurement system 400 is configured to determine a deformation of an object 410 having a front surface 410.1 and a back surface 410.2. The object, e.g. a patterning device for use in a lithographic apparatus, is provided with a pattern (not shown) which may be on the front surface 410.1, or the back surface 410.2 or at an interior of the patterning device. The measurement system 400 as shown comprises an interferometer system 420 and a processing system 430.

In the embodiment as shown, the interferometer system 420 comprising a light source 422 and a detector system 424, the detector system 424 comprising a first detector 424.1 and a second detector 424.2. In the embodiment as shown, the interferometer system 420 is configured, using beam splitters 426.1, 426.2 and 426.3, to project a pair of measurement beams 440.1, 440.2 onto a location 450 on the object. Within the meaning of the present invention, the objects that are subjected to a measurement process typically have a planar shape, e.g. extending in an XY-plane. A location on the object thus refers to a position in the XY-plane which can be characterized by (x, y) coordinates. In the embodiment as shown, the location 450 is thus accessed by the measurement beams on both the front surface side and the back surface side, whereby the measurement beam 440.1 is projected on the front surface 410.1 and the measurement beam 440.2 is projected on the back surface 410.2 at substantially the same (x, y) coordinates. In the embodiment as shown, the measurement beams 440.1 and 440.2 are reflected off of the respective front and back surfaces 410.1 and 410.2, thereby generating a reflected measurement beam off the front surface 410.1 of the object 450 and a reflected measurement beam off the back surface 410.2 of the object 450. The reflected measurement beams are subsequently received by the detectors 424.1 and 424.2. In the embodiment as shown, the detectors 424.1 and 424.2 are further configured to receive reflected beams off respective references or reference objects 470.1, 470.2. In accordance with the present invention, the detector system 424 is further configured to output one or more signals 460.1, 460.2 representative of the received reflected measurement beams. In the embodiment as shown, the detectors 424.1 and 424.2 are thus configured to output signals 460.1 and 460.2 and provide them to the processing system 430, e.g. to an input terminal 430.1 of the processing system 430. In the embodiment as shown, the interferometer system 420 can be considered a combination of two Michelson interferometers 420.1, 420.2 sharing the light source 422, whereby such interferometers are used to determine a position of the object 410, relative to a reference. In particular, in the arrangement as shown, the output signals 460.1 of the interferometer 420.1 can be used to determine a Z-position of the front surface 410.1 of the object 410, whereas the output signals 460.2 of the interferometer 420.2 can be used to determine a Z-position of the back surface 410.2 of the object. When combined with knowledge about the distance D in the Z-direction between both interferometers, the thickness or height d of the object at the location 450 can be determined by the processing system 430, based on the signals received.

In accordance with the present invention, the measurement system 400 is configured to generate the reflected measurement beams at a plurality of different locations, i.e. at different positions of the object relative to the interferometer system in the XY-plane, and provide, for each of the plurality of locations, one or more output signals such as output signals 460.1 and 460.2 to the processing system 430 of the measurement system 400. In an embodiment, the processing system 430 of the measurement system 400 of the present invention may comprise a memory unit, e.g. for storing the receive signals, and a processing unit comprising a processor or microprocessor or computer or the like for processing the received signals. The processing system may further comprise an input terminal such as input terminal 430.1 configured to receive input signals such as the signals 460.1, 460.2 that are outputted by the detector system. The processing system as applied in the measurement system according to the present invention may further be configured to output, e.g. via an output terminal of the processing system, any signals such as signals representing results of the processing performed by the processing system, e.g. processing performed by a processing unit of the processing system 430.

In accordance with the present invention, the processing system 430 is configured to determine, based on the plurality of signals as received, i.e. the signals received when measurements at the plurality of locations are performed, a physical characteristic of the patterning device, the physical characteristic being representative of a deformation of the object and determine, based on the physical characteristic and a mathematical model of the object, a deformation of the pattern. In the embodiment as shown in FIG. 4, the signals as received may e.g. be used by the processing system 430 to determine a deformation of the object in the Z-direction. In particular, the signals as retrieved during the measurement of the Z-position of the front surface 410.1 and the back surface 410.2 at the plurality of locations, may e.g. be used by the processing system 430 to determine the height of the object at the plurality of locations. Variations in the determined height, or a difference between the determined height and an expected, nominal height, may be considered a physical characteristic of the deformation of the object. In case the object has been subjected to a heat load, e.g. in case the object is a patterning device used in a lithographic apparatus, the deformation may e.g. be caused by a heating of the object. In such case, the physical characteristic as determined may also be a temperature or a temperature offset at the plurality of locations. As will be explained in more detail below, the variations in the determined height or optical path length may be used to determine the temperature along the height or optical path length at the plurality of locations.

In accordance with the present invention, the processing system 430 of the measurement system 400 is configure to determine, based on the physical characteristic of the object as determined and a mathematical model of the object, a deformation of the pattern. In the embodiment as shown, the height variations as determined for the plurality of locations may be considered deformations of the object in the Z-direction. Using such deformations as input to a mathematical model of the object, the corresponding deformations of the object in the XY-plane, in particular a deformation of a pattern provided on the object and extending in the XY-plane, may be derived.

In the embodiment as shown, the interferometer system 420 may be configured to determine the distance in the Z-direction of the front surface and the back surface of the object at a particular 'single' location in the XY-plane. By means of displacing the object 410 relative to the measurement beams 449.1 and 440.2 in both the X-direction and the Y-direction, measurements may be performed that, cover an area, e.g. an area which includes the pattern on the object. By doing so, a two-dimensional grid of measurement data may be obtained, which may e.g. be used by the processing system 430 to derive a two-dimensional deformation profile of the object in the Z-direction.

Alternatively, the interferometer system 420 may e.g. be configured to determine the distance in the Z-direction of the front surface and the back surface of the object at an array of different locations in the XY-plane at the same time, e.g. an array of locations having the same Y-coordinate but different X-coordinates. This can e.g. be realized by applying multiple discrete measurement beams arranged in the X-direction or by means of a measurement beam having an elongated cross-section in the X-direction, or a combination thereof. By doing so, multiple measurements corresponding to measurements at different locations having a different X-coordinate may be performed in parallel. In such an arrangement, a relative displacement of the measurement system 400 and the object need only be enabled in the Y-direction in order to obtain a two-dimension set of measurement data.

In the embodiment as shown, use is made to two Michelson interferometers to determine the height of an object at a particular location. It should be clear that other types of optical measurement systems enabling to determine the height or thickness of an object could be considered as well.

In the embodiment as shown, the height or thickness of the object is determined by projecting a pair of measurement beams 440.1 and 440.2 onto respective front and back surfaces 410.1 and 410.2. in such case, use is made of reflected beams that are externally reflected off surfaces of the object. Such an arrangement may e.g. be applied in case the object is not transmissive to the measurement beam or beams, e.g. in case the object is a reflective patterning device.

In case the object is at least partly transmissive to the measurement beams as applied, alternative arrangements could be implemented as well, whereby us is made of an external reflection, e.g. at a front surface of the object and an internal reflection, e.g. at the back surface of the object. Using both reflected measurement beams, an optical path length of the measurement beam through the object can be determined, whereby said optical path length may be subsequently used, in a similar manner as the height assessed in the embodiment shown in FIG. 4, to assess or determine a physical characteristic representing a deformation of the object.

Figure 5:
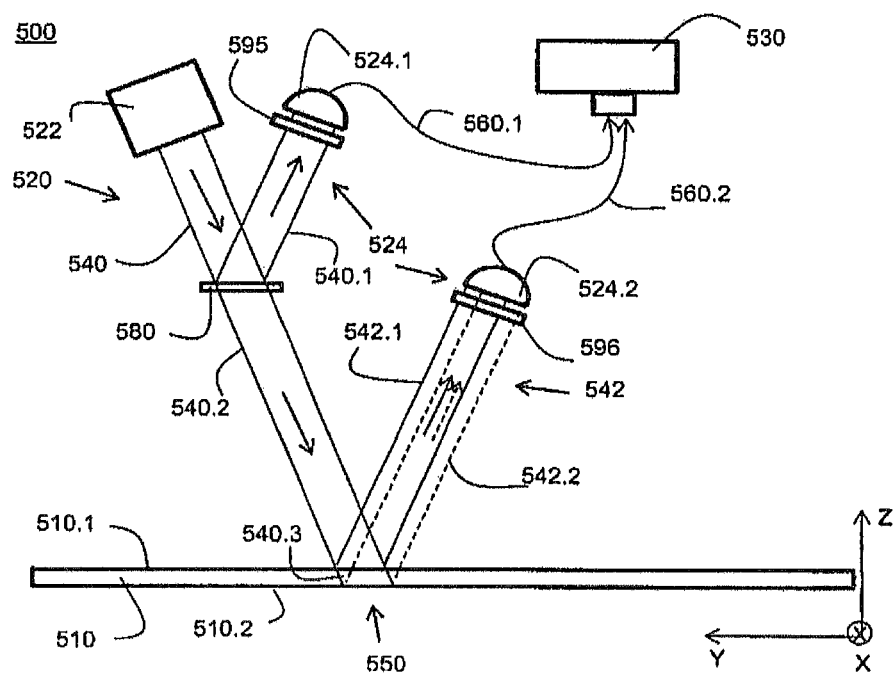
FIG. 5 schematically depicts a second embodiment of a measurement system according to the present invention.

FIG. 5 schematically shows an second embodiment of a measurement system 500 according to the present invention. In accordance with the present invention, the measurement system 500 is configured to determine a deformation of an object 510 having a front surface 510.1 and a back surface 510.2. The measurement system comprises an interferometer system 520 and a processing system 530. In the embodiment as shown, the interferometer system 520 comprises a light source 522 and a detector system 524. In the embodiment as shown, the light source 522 is configured to generate a measurement beam 540 comprising two components having different wavelengths or frequencies. In an embodiment, the difference between both wavelength or frequency components is comparatively small. In an embodiment, the light source may be a Zeeman split laser including collimating optics to generate, as a measurement beam 540, a collimated beam at two slightly different wavelengths. As shown, the measurement beam 540 is projected onto a location 550 on the object 510.

In the embodiment as shown, a first component of the measurement beam 540 is a left-hand circularly polarized beam, whereas the second component of the measurement beam 540 is a right-hand circularly polarized beam. The interferometer system 520 further comprises a beam sampler 580 to sample a portion of the measurement beam 520 and direct the sampled portion 540.1 to a reference sensor, e.g. a reference photodiode 524.1 of the detector system 524. In an embodiment, the beam sample 580 may comprise a plate, e.g. made of glass, having an anti-reflective coating on one side, such that only one side of the plate generates a reflection of the measurement beam 540. The sampled portion 540.1 of the measurement beam is provided to the reference photodiode 524.1 via an analyzer 595. In the embodiment as shown, the analyzer 595 comprises a linear polarizer. The resulting beam, i.e. the sampled portion 540.1 of the measurement beam 540 after being passed through the linear analyzer 595 will have a so-called beating, a periodic intensity variation. In particular, the intensity of the resulting beam will vary at a frequency corresponding to the frequency difference existing between the two components of the measurement beam 540. The portion 540.2 of the measurement beam 540 that passes the beam sampler 580 is projected onto the object 510, in particular onto the location 550 on the object. As shown, part of this portion 540.2 of the measurement beam 540 is reflected on the front surface 510.1 of the object 510, while another part 540.3 propagates into the object 510 and reflects on the back surface 510.2 of the object 510. The resulting beam 542 that is reflected off the object, also referred to as the reflected measurement beam 542 thus comprises a first reflected measurement beam 542.1, reflected off the front surface 510.1 of the object 510 and a second reflected measurement beam 542.2 (indicated in dotted line), reflected off the back surface 510.2 of the object 510. This reflected measurement beam 542 will also, when analyzed, have a beating, i.e. a periodically varying intensity. In the embodiment as shown, the detector system 524 of the interferometer system 520 therefore comprises a measurement photodiode 524.2 for measuring the reflected measurement beam 542, after being passed through an analyzer 596. In the embodiment as shown, the analyzer 596 also comprises a linear polarizer. Because the reflected measurement beam 542 includes a component 5412 that has travelled or propagated back and forth through the object 510, a phase of the beating of the reflected measurement beam will be different from the phase of the beating as observed by the reference photodiode 524.1. The phase difference between the beatings or beat components as received by the reference photodiode 524.1 and the measurement photodiode 524.2 is a measure for the optical path length of the beam path followed by the part 540.3 of the measurement beam 540 that has propagated back and forth through the object 510. When, due to a particular heat load on the object 510, the object 510 expands at the location 550, the optical path length of the beam part 540.3 will change, resulting in a change in the phase difference between the beat components. In particular, a change in the phase difference between the beat components can be associated with a temperature difference of the object at the measurement location 550, or with a height variation of the object at the measurement location 550.

In case a normal incidence of the measurement beam component 540.3 on the object 510 is assumed, the optical path length L can be expressed as a function of a temperature offset ΔT by the following equation (1):

$$L = 2 \cdot H \cdot (n_0 + n' \cdot \Delta T)(1 + \alpha \cdot \Delta T) \approx L_0 + 2 \cdot H \cdot (n' + n_0 \cdot \alpha) \cdot \Delta T \quad (1)$$

Where:
H=the nominal thickness or height of the object 510 at the measurement location 550, i.e. the height in the indicated Z-direction;
α=the thermal expansion coefficient of the object's material;
$n_0$=the refractive index of the object's material at a reference temperature;
n'=the temperature coefficient of the refractive index of the object's material;
ΔT=the temperature offset from the reference temperature (e.g. 22° C.)
$L_0$=the nominal optical path length=$2Hn_0$.

It should be pointed out that the temperature offset ΔT refers to an average temperature of the object along the Z-direction at the measurement location 550.

The temperature dependency of the phase difference may then be expressed as:

$$\Delta \varphi = \frac{2\pi \cdot (L - L_0)}{\lambda} = \frac{4\pi \cdot H \cdot (n' + n_0 \cdot \alpha)}{\lambda} \cdot \Delta T \quad (2)$$

Where:
Δφ=the occurring phase shift at a temperature offset ΔT;
λ=a nominal wavelength of the measurement beam.

At λ=600 nm, the parameters for fused silica, a typical material used for patterning devices are:
$n_0$=1.46;
n'=$8.86e^{-6}$ $K^{-1}$;
α=$5.5e^{-7}$ $K^{-1}$.

The optical parameters are taken D. B. Leviton and B. J. Frey, "Temperature-dependent absolute refractive index measurements of synthetic fused silica," Tech. Rep. arXiv:0805.0091 (2008). This results in a measurement sensitivity of Δφ/ΔT=1.28 rad/K. This sensitivity enables to determine, based on the measured phase shift $\Delta_T$ the temperature with a sufficiently high resolution, e.g. 0.2 K or better.

It should also be pointed out that the measured phase shift Δφ may also be used to determine a variation or change ΔH of the height H of the object, by considering that ΔH=H a ΔT.

In the embodiment as shown, the detector system 524 is configured to output a signal 560.2 representative of the reflected measurement beams, i.e. the first and second reflected measurement beams 542.1, 542.2 to the processing system 530 of the measurement system 500. In particular, the measurement photodiode 524.2 of the detector system 524 is configured to output the signal 560.2 and provide it to an input terminal 530.1 of the processing system 530. In a similar manner, the reference photodiode 524.1 of the detector system 524 is configured to output a signal 560.1 representative of the sampled measurement beam. Using both signals 560.1 and 560.2, the processing system 530 may derive a physical characteristic characterizing a deformation of the object 510 at the location 550. In particular, using the above equations, the processing system 530 may be configured to determine the phase shift Δφ and determine, based on the phase shift Δφ either the temperature offset ΔT of the object at the plurality of locations, or the height variation ΔH of the object at the plurality of locations. Both physical characteristics characterizing a deformation of the object and may be used, in a mathematical model of the object, to determine a deformation of the pattern.

In accordance with the present invention, the measurement system 500 is configured to capture the reflected measurement beam 542 from a plurality of locations on the object. In this respect, similar considerations as discussed with reference to the first embodiment may be applied; in order to capture the reflected measurement beam 542 from a plurality of locations on the object, the object and the measurement system, in particular the measurement beam 540, may be displaced relative to each other. Further, rather than applying a measurement beam having a spot-shaped cross-section, the measurement beam 540 may have an elongated shape, e.g. elongated in the X-direction or may comprise a plurality of spot-shaped beams, e.g. arranged adjacent each other in the X-direction.

Figure 6:
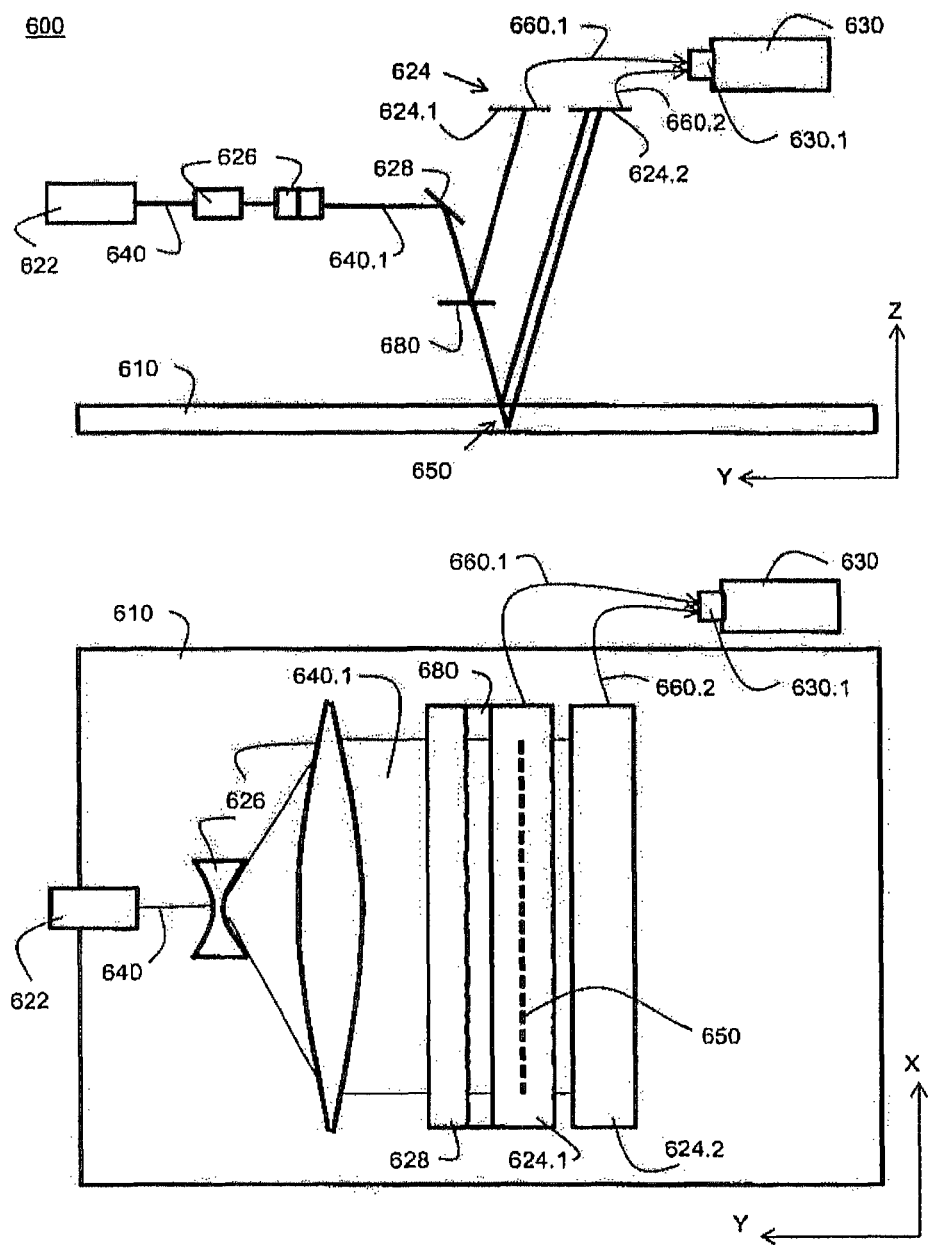
FIG. 6 schematically depicts a third embodiment of a measurement system according to the present invention.

In an embodiment, a measurement beam emitted by the light source is converted into a light sheet, e.g. a laser light sheet extending in the X-direction. In such an embodiment, which is schematically shown in FIG. 6, the photodiodes 524.1 and 524.2 may be replaced by arrays of photodiodes. In this respect, it should be noted that within the present invention various types of sensors or detectors may be applied in the detector system of the measurement system, ranging from photodiodes to one or two-dimensional arrays of photodiodes or one or two dimensional cameras, e.g. including CCD or CMOS arrays.

In FIG. 6, a third embodiment of a measurement system 600 according to the present invention is schematically shown. The top portion of FIG. 6 shows a cross-sectional YZ view, whereas the bottom portion schematically shows a top view of the measurement system. The measurement system 600 comprising an interferometer system comprising a light source 622, e.g. a Zeeman laser configure to emit a laser beam 640, e.g. a laser beam comprising two components as described with reference to FIG. 5, and a detector system 624. In the embodiment as shown, the interferometer system 620 further comprises a lens system 626 for converting the laser beam 640 into a laser light sheet 640.1 which can be projected, using mirror 628 of the interferometer system 620 onto an object 610 e.g. a patterning device as applied in a lithographic apparatus. In the embodiment as shown, the interferometer system 620 further comprises a beam sampler 680 for deflecting a portion of the measurement beam, i.e. the laser light sheet 640.1, towards a reference photodiode array 624.1 of the detector system 624. The detector system 624 further comprises a measurement photodiode array 624.2 configured to received a reflected measurement beam comprising a first reflected measurement beam reflected off the front surface of the object 610 and a second reflected measurement beam reflected off the back surface of the object 620. The beams or beam portions as received by the reference photodiode array 624.1 and the measurement photodiode array 624.2 may be processed, in a similar manner as described above, by means of a processing system 630 of the measurement system 600. In particular, the measurement photodiode array 624.2 of the detector system 624 is configured to output the signal 660.2 and provide it to an input terminal 630.1 of the processing system 630. In a similar manner, the reference photodiode array 624.1 of the detector system 624 is configured to output a signal 660.1 representative of the sampled measurement beam. Using both signals 660.1 and 660.2, the processing system 630 may derive a physical characteristic representing a deformation of the object 110 at the measurement locations 650, i.e. the area onto which the laser light sheet 640.1 is projected. By applying a laser light sheet 640.1 instead of a laser spot, the physical characteristic representing the deformation of the object 610, e.g. ΔT or ΔH, may be assessed at a plurality of locations 650 arranged in the X-direction, without having to displace the object relative to the measurement system in the X-direction. By displacing the object 610 relative to the measurement system 620, in particular the measurement laser light sheet 640.1, in the Y-direction, the physical characteristic characterizing a deformation of the object may be determined over an area of the object, e.g. an area covering a pattern that is applied on the object. With respect to FIG. 6, it should be pointed out that, for clarity reasons, additional useful components of the interferometer system, such as polarizers, wave plates, analyzers, etc. are not shown. The use of such components in embodiments of the present invention is explained in more detail below. As will be clear to the skilled person, the use of a laser light sheet as schematically shown in FIG. 6 may also be implemented in those embodiments.

In a similar manner as described with reference to FIG. 4, the processing systems 530 and 630 of the second and third embodiment of the measurement system according to the present invention are further configured to determine, based on the physical characteristic representing the deformation of the object and a mathematical model of the object, a deformation of the pattern.

With respect to the arrangement as shown in FIG. 6, it may be worth nothing that the reference photodiode array 624.1 may be replaced by a single photodiode which analyses a portion of the laser light sheet 640.1 that is sampled in a similar manner as described with reference to FIG. 4. As will be understood by the skilled person, the phase of the beating or beat component as detected by the reference photodiode array as shown in FIG. 6 will be the same for all photodiodes of the array, since they all receive a sample of the same measurement beam.

In the embodiments as described with reference to FIGS. 5 and 6, the reflected measurement beam as received by the measurement photodiode or the measurement photodiode array is a combination of four beams; the measurement beam as applied in the second and third embodiment comprises two components (having a different frequency), each of which is reflected both at the front surface and at the back surface of the object, resulting in four components in the reflected measurement beam. As a result, the phase difference and the amplitude of the reflected measurement beam as received by the measurement photodiode or photodiode array will depend on the thickness or height H of the object and the reflection coefficients of the front and back surfaces.

In order to simplify the analysis of the received reflected measurement beam, it would be advantageous to ensure that the reflected measurement beam as received by the detector system only comprises two components, the components having a different wavelength and being reflected off of different surfaces.

Figure 7:
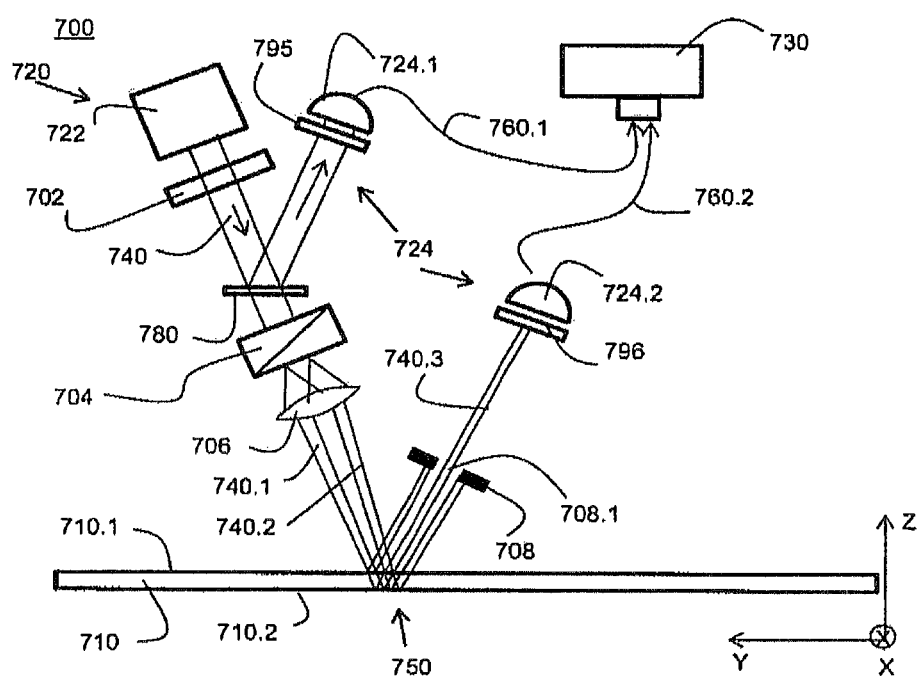
FIG. 7 schematically depicts a fourth embodiment of a measurement system according to the present invention.

In FIG. 7, a fourth embodiment of the measurement system 700 according to the present invention is schematically shown, the embodiment enabling that the reflected measurement beam as received by the detector system only comprises a first reflected measurement beam having a first wavelength and being reflected off the front surface 710.1 of the object 710 and a second reflected measurement beam having a second wavelength, different from the first wavelength, and being reflected off the back surface 710.2 of the object 710.

In the embodiment as shown, the selection of the mentioned components is made possible by means of a spatial separation of both components in the measurement beam and a subsequent selective blocking of the reflected measurement beams. The measurement system 700 as schematically shown in FIG. 7 comprises an interferometer system 720 and a processing system 730. The interferometer system 720 comprises a light source 722 which is similar to the light source shown in FIG. 4, i.e. a Zeeman split laser configured to emit a measurement beam 740 comprising two components having different wavelengths, whereby a first component of the measurement beam 740 is a left-hand circularly polarized beam, whereas the second component of the measurement beam 740 is a right-hand circularly polarized beam.

The interferometer system 720 is further configured to provide in a spatial separation of both components of the measurement beam in the Y-direction. In order to realize this, use is made of a quarter-wave plate 702 and a Wollaston polarizing beam splitter 704. The quarter-wave plate 702 modifies the circularly polarized components of the measurement beam 740 into linear polarized components, having orthogonal polarizations, which are subsequently split up by the Wollaston polarizing beam splitter in a first component, having the first wavelength and a polarization in the plane of the drawing and a second component, having the second wavelength and a polarization perpendicular to the plane of the drawing.

In the embodiment as shown, the interferometer system 720 further comprises a lens 706 for redirecting and focusing the first and second components, spatially separated, onto the object 710, in particular onto a location 750 on the object 710. Due to the spatial separation of the first component 740.1 and second component 740.2 of the measurement beam, the components being projected onto the object 710, a corresponding spatial separation can be realized between the reflected components. By an appropriate dimensioning of the Wollaston polarizing beam splitter 704 and/or the lens 706, one can ensure that the front surface reflection of the second component 740.2 substantially overlaps or coincides with the back surface reflection of the first component 740.1, while the front surface reflection of the first component 740.1 and the back surface reflection of the second component 740.2 are spatially separated. By means of an appropriate beam blocker 708, e.g. a non-transmissive plate provided with an aperture 708.1, the front surface reflection of the first component 740.1 and the back surface reflection of the second component 740.2 can be blocked. Subsequently, the overlapping front surface reflection of the second component 740.2 and the back surface reflection of the first component 740.1, indicated by reference number 740.3 can be provided to a measurement photodiode 724.2 of the detector system 724 and analyzed, together with a sample of the measurement beam 740 that is sampled using a beam sampler 780 and that is received by a reference photodiode 724.1 of the detector system 724, in a similar manner as discussed above. Similar to the aforementioned embodiments, analyzers 795 and 796 are applied in association with the photodiodes 724.1 and 724.2. In the embodiment as shown, the detector system 724 is configured to output a signal 760.2 representative of the reflected measurement beams 740.3 to the processing system 730 of the measurement system 700, In particular, the measurement photodiode 724.2 of the detector system 724 is configured to output the signal 760.2 and provide it to an input terminal 730.1 of the processing system 730. In a similar manner, the reference photodiode 724.1 of the detector system 724 is configured to output a signal 760.1 representative of the sampled measurement beam. Using both signals 760.1 and 760.2, the processing system 730 may derive a physical characteristic representing a deformation of the object 710 at the location 750.

With respect to the use of the quarter-wave plate 702, the Wollaston prism 704, the lens 706 and the beam blocker 708 which are applied to provide in the aforementioned selection of the reflected measurement beams, it is worth noting that such a selection may be realized in various other manners, without departing from the scope of the invention.

As will be clear to the skilled person, a non-normal angle of incidence has to be applied for the measurement beam components 740.1 and 740.2 in order to realize the described selection of reflected measurement beams. However, it is preferred to have the angle of incidence of the measurement beam components 740.1 and 740.2 as close to normal as possible because this will reduce the sensitivity of the measurement to small tilt errors, i.e. rotations of the object about the X-axis, relative to the interferometer system.

Figure 8:
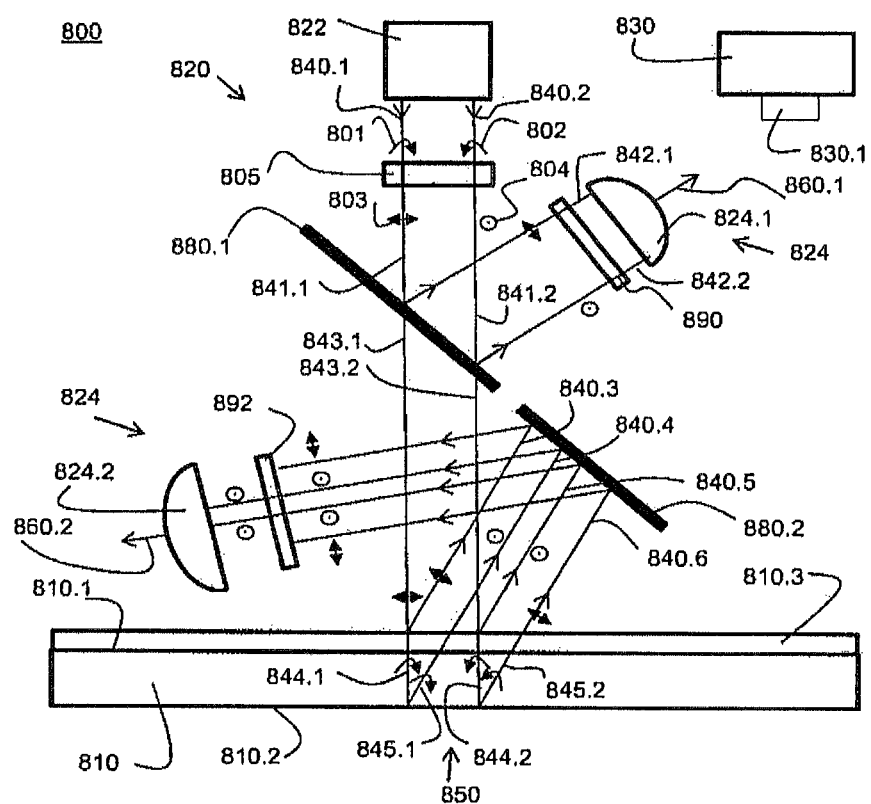
FIG. 8 schematically depicts a fifth embodiment of a measurement system according to the present invention.

In FIG. 8, a fifth embodiment of a measurement system 800 according to the present invention is schematically shown. The embodiment as shown enables the appropriate or desired selection of the reflected measurement beams, i.e. such that the reflected measurement beam as received by the detector system 824 only comprises a first reflected measurement beam having a first wavelength and being reflected off the front surface of the object and a second reflected measurement beam having a second, different from the first, wavelength and being reflected off the back surface of the object. At the same time, the embodiment does not require the application of a non-normal angle of incidence, i.e. a normal angle of incidence can be applied, thus substantially removing the sensitivity of the measurement to small tilt errors.

In order to realize this embodiment, it is required that the object 810 that is being examined, is provided with a quarter-wave coating 810.3 on the front surface 810.1. In FIG. 8, reference numbers 801, 802, 803 and 804 respectively refer to symbols indicating a left-hand circularly polarized beam, a right-hand circularly polarized beam, a linear polarized beam in the plane of the drawing and a linear polarized beam perpendicular to the plane of the drawing. It should further be noted that the beams 840.1 and 840.2 as emitted by the light source 822, e.g. a Zeeman split laser as discussed above, and the reflected beams 840.3, 840.4, 840.5 and 840.6 are shown as spatially separated. Also, the reflected beams are shown at a non-normal angle relative to the front surface 810.1. This is merely done for clarity purposes; to more clearly show the different components and their transformations. In practice, the emitted light beams 840.1 and 840.2 are assumed to be overlapping and, as a result, the reflected beams will overlap as well and be reflected off the front and back surfaces 810.1, 810.2 at a normal angle, i.e. the angle of incidence of the emitted light beams 840.1 and 840.2. In the embodiment as shown in FIG. 8, the measurement system 800 comprises an interferometer system 820 and a processing system 830, the interferometer system 820 comprising a light source 822 and a detector system 824. In the embodiment as shown, the light source 822 comprises a Zeeman split laser that generates a light beam 840.1 at wavelength $\lambda_1$ and light beam 840.2 at wavelength $\lambda_2$ different from $\lambda_1$. The two light beams 840.1 and 840.2 are circularly polarized with opposite rotation directions. A quarter-wave plate 805 of the interferometer system 820 converts the light beams 840.1 and 840.2 into linearly polarized light beams 841.1 and 841.2 that are again at orthogonal polarizations. The beams 841.1 and 841.2 are subsequently partially reflected from a beam splitter 880.1, e.g. a 50% reflective, not polarization-selective beam splitter, towards a first analyzer 890. In the embodiment as shown, the analyzer 890 is a polarizing filter with the polarization axis at 45 deg. It can be pointed out that any polarizing axis greater than 0 deg. and smaller than 90 deg. could also be applied. The two components of the reflected light beams 841.1 and 841.2 will interfere with each other, resulting in a reference signal consisting of components 842.1 and 842.2, said reference signal having a beating or beat component. This signal is received, in the embodiment as shown, by a reference photodiode 824.2 of the detector system 824. The portion of the emitted light beams 840.1 and 840.2 that passes through the beam splitter 880.1, i.e. light beams 843.1 and 843.2 are reflected from the object 810, which has a quarter-wave coating 810.3 on its front surface 810.1. The light beams 840.3 and 840.5 that are reflected from the top of the quarter-wave coating 810.3 do not change their polarization. The light beam portions that propagate through the object 810, indicated by reference numbers 844.1, 845.1, 844.2 and 845.2 pass through the quarter-wave coating twice and do change their polarization. As a result of the application of the quarter-wave plate 805 and the quarter-wave coating 810.3, the reflected measurement beams 840.4 and 840.5 have a different polarization then the reflected measurement beams 840.3 and 840.6, as can be seen in FIG. 8. The reflected beams off the object 810 are subsequently reflected by the beam splitter 880.2 towards the photodiode 824.2. As such, by applying a second analyzer 892, e.g. a polarizing filter that selectively transmits the reflected measurement beams 840.4 and 840.5 and blocks the reflected measurement beams 840.3 and 840.6, the desired selection of reflected measurement beams is made, which can be provided to a measurement photodiode 824.2 of the detector system 824 of the interferometer system 820. The beams or beam portions as received by the reference photodiode 824.1 and the measurement photodiode 824.2 may be processed, in a similar manner as described above, by means of a processing system 830 of the measurement system 800. In particular, the measurement photodiode array 824.2 of the detector system 824 is configured to output the signal 860.2 and provide it to an input terminal 830.1 of the processing system 830. In a similar manner, the reference photodiode 824.1 of the detector system 824 is configured to output a signal 860.1 representative of the sampled measurement beam. Using both signals 860.1 and 860.2, the processing system 830 may derive a physical characteristic representing a deformation of the object 810 at the measurement location 850. The processing system 830 may further be configured to determine, based on the physical characteristic of the object and a mathematical model of the object, a deformation of a pattern that is provided on the object 810.

With respect to the embodiment as shown in FIG. 8, it may be worth mentioning that part of the reflected beams may return towards the light source 822 and may interfere with the proper stable operation of the light source. In order to mitigate this, a gray filter or attenuator may be provided in the beam path to the tight source 822.

The various embodiments of the measurement system according to the present invention that are discussed above thus enable to determine a deformation of a pattern, e.g. a pattern provided on a patterning device, based on a physical characteristic of the object, as determined using an interferometer system. Using the interferometer system, a deformation of the height or the optical path length of the object may be determined at a plurality of locations on the object and applied in a mathematical model of the object to arrive at the deformation of the pattern. Alternatively, a temperature profiled may be derived from the measurements made using the interferometer system and applied in the mathematical model of the object to arrive at the deformation of the pattern.

In an embodiment, the deformation of the pattern as derived is an in-plane deformation. The physical characteristic as determined using the measurement systems as described may be considered an averaged characteristic over the height or thickness of the object. In particular, the temperature offset $\Delta T$ as determined at a particular location on the object will represent the average temperature offset along the beam path as followed.

It is known that objects, such as patterning devices as described in FIG. 2, may suffer not only from in-plane deformations, but also from out-of-plane deformations, e.g. curvatures about the X-axis or the Y-axis. Such deformations may e.g. be caused by non-uniform temperature distributions in the object, along the height of the object, i.e. along the Z-direction as indicated in FIG. 2. In order to assess a non-uniformity in the temperature distribution along the height of the object, the following approach may be adopted:

In an embodiment, the measurement system according to the present invention is further equipped with one or more temperature sensors configured to determine a temperature of either the front surface, the back surface or both. In such embodiment, an array of temperature sensors 210 as shown in FIG. 3 may e.g. be applied to determine the temperature profile of the front surface of an object. Using such a measurement system enables to determine both the temperature profile of the front surface of an object, i.e. surface temperature profile, and a temperature profile representing the average temperature offset over the front surface. More specifically, using the temperature sensors and the interferometer system, one may obtain, at each measurement location, a temperature or temperature offset at the front surface and an averaged temperature or averaged temperature offset along the height at the measurement location. In case these temperatures differ, i.e. in case the front surface temperature as measured at the measurement location differs from the average temperature as determined at the measurement location, one can estimate an occurring temperature gradient along the height at the measurement location. Such a temperature gradient may then be determined for each measurement location and applied to a mathematical model e.g. a thermo-mechanical finite element model, to derive a deformation of the object, in particular of a pattern on the object, due to the temperature gradient. Such an approach may result in an estimation of additional deformations of the pattern, in particular an estimation of out-of-plane deformations of the pattern.

The measurement system according to the present invention may e.g. be implemented in a lithographic apparatus according to the present invention, in order to determine a deformation of a pattern provided on a patterning device that is applied in the apparatus to project the pattern onto a substrate.

In an embodiment, a measurement system according to the present invention may be applied to determine a deformation of a particular pattern on a particular patterning device, based on measurements performed in between the exposure of different substrates or different lots of substrates in a lithographic apparatus according to the present invention. Using the measurements, a measurement system according to the present invention may be configured to determine the deformation of the pattern under different operating conditions, e.g. depending on the illumination dosage as applied or depending on the number of exposures performed per unit of time. When this deformation is available, it may e.g. be applied in another lithographic apparatus, e.g. applying the same or a similar patterning device, which need not be equipped with a measurement system according to the present invention. Such an apparatus may then be configured to execute a program to control an operational parameter of the apparatus, in accordance with the deformation of the pattern as determined by the measurement apparatus. As mentioned above, such an operational parameter may e.g. be a setting of an illumination system or projection system of the apparatus or a set point of a positioning device of the apparatus, the positioning device being configured to control a position of the patterning device relative to the substrate during the exposure process.

In an embodiment, there is provided a measurement system configured to determine a deformation of an object having a front surface and a back surface and being provided with a pattern, the measurement system comprising: a processing system and an interferometer system comprising a light source and a detector system; the light source being configured to emit, to each of a plurality of locations on the object, one or more measurement beams in order to generate, at each of the respective plurality of locations, a reflected measurement beam off the front surface of object and a reflected measurement beam off the back surface of the object; the detector system being configured to receive, for each of the plurality of locations, the respective reflected measurement beams and output one or more signals representative of the received reflected measurement beams to the processing system, wherein the processing system is configured to: receive, for each of the plurality of locations, the one or more signals; determine, based on the plurality of one or more signals as received, a physical characteristic of the object, the physical characteristic being representative of a deformation of the patterning device; and determine, based on the physical characteristic of the object and a mathematical model of the object, a deformation of the pattern, wherein the physical characteristic is a temperature or a temperature offset at the plurality of locations.

In an embodiment, the deformation of the patterning device comprises a local deformation of the patterning device at the plurality of locations. In an embodiment, the interferometer system is configured to: project a measurement beam to the front surface of the patterning device, a first portion of the measurement beam being reflected off the front surface, so as to form the reflected measurement beam off the front surface; a second portion of the measurement beam propagating through the patterning device and at least partially reflecting off the back surface, propagating towards the front surface and at least partially propagates outside the patterning device, so as to form the reflected measurement beam off the back surface. In an embodiment, the measurement beam comprises a first component having a first frequency and a second component having a second frequency, the detector system being configured to determine a phase of a beat component of the measurement beam and a phase of a beat component of the reflected measurement beams. In an embodiment, the interferometer system comprises a beam sampler configured to deflect a sample portion of the measurement beam to a first detector of the detector system for determining the phase of the beat component of the measurement beam. In an embodiment, the first component is left-hand circularly polarized and the second component is right-hand circularly polarized; the interferometer system further comprising a first analyzer through which the sample portion propagates prior to the first detector. In an embodiment, the first component is right-hand circularly polarized and the second component is left-hand circularly polarized; the interferometer further comprising a first analyzer through which the sample portion propagates prior to the first detector. In an embodiment, the interferometer system is configured to provide a reflected measurement beam off the front surface having the first frequency and a reflected measurement beam off the back surface having the second frequency to a detector of the detector system and prohibit a reflected measurement beam off the front surface having the second frequency and a reflected measurement beam off the back surface having the first frequency to reach the detector. In an embodiment, the interferometer system is configured to spatially displace the first component relative to the second component prior to impacting the patterning device. In an embodiment, the measurement system further comprises one or more temperature sensors configured to determine a surface temperature profile of the front surface or the back surface or both. In an embodiment, the physical characteristic is a temperature or a temperature offset at the plurality of locations and wherein the processing system is configured to determine a temperature gradient of the patterning device based on the temperature or the temperature offset at the plurality of locations and the surface temperature profile. In an embodiment, the processing system is configured to determine an out-of-plane deformation of the pattern based on the temperature gradient of the object and the mathematical model of the object.

In an embodiment, there is provided a lithographic apparatus comprising: an illumination system configured to condition a radiation beam; a support constructed to support a patterning device comprising a pattern, the patterning device being capable of imparting the radiation beam with the pattern in its cross-section to form a patterned radiation beam; a substrate table constructed to hold a substrate; a positioning device configured to position the support relative to the substrate table; and a projection system configured to project the patterned radiation beam onto a target portion of the substrate, wherein the apparatus further comprises a measurement system as described herein.

In an embodiment, there is provided a device manufacturing method comprising transferring a pattern from a patterning device onto a substrate using a lithographic apparatus as described herein. In an embodiment, transferring the pattern is preceded by determining a deformation of the pattern by means of the measurement system of the lithographic apparatus, and adjusting a setting of the illumination system or the projection system of the lithographic apparatus based on the deformation of the pattern.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A measurement system configured to determine a deformation of an object having a front surface, a back surface and a pattern, the measurement system comprising:

a processing system; and
an interferometer system comprising a radiation output and a detector system, the radiation output configured to emit, to each of a plurality of locations on the object, one or more measurement beams in order to generate, at each of the respective plurality of locations, a reflected measurement beam off the front surface of object and a reflected measurement beam off the back surface of the object and the detector system configured to receive, for each of the plurality of locations, the respective reflected measurement beams and output one or more signals representative of the received reflected measurement beams to the processing system;
wherein the processing system is configured to:
receive, for each of the plurality of locations, the one or more signals;
determine, based on the plurality of one or more signals as received, a physical characteristic of the object, the physical characteristic being representative of a deformation of the object; and
determine, based on the physical characteristic of the object and a mathematical model of the object, a deformation of the pattern, wherein the physical characteristic comprises a temperature or a temperature offset at the plurality of locations.

2. The measurement system according to claim 1, wherein the deformation comprises a local deformation of the object at the plurality of locations.

3. The measurement system according to claim 1, wherein the interferometer system is configured to project a measurement beam to the front surface of the object, a first portion of the measurement beam being reflected off the front surface, so as to form the reflected measurement beam off the front surface and a second portion of the measurement beam propagating through the object and at least partially reflecting off the back surface, propagating towards the front surface and at least partially propagates outside the object, so as to form the reflected measurement beam off the back surface.

4. The measurement system according to claim 3, wherein the measurement beam comprises a first component having a first frequency and a second component having a second frequency, the detector system being configured to determine a phase of a beat component of the measurement beam and a phase of a beat component of the reflected measurement beams.

5. The measurement system according to claim 4, wherein the interferometer system comprises a beam sampler configured to deflect a sample portion of the measurement beam to a first detector of the detector system to determine the phase of the beat component of the measurement beam.

6. The measurement system according to claim 5, wherein the first component is left-hand circularly polarized and the second component is right-hand circularly polarized and the interferometer system further comprises a first analyzer through which the sample portion propagates prior to the first detector.

7. The measurement system according to claim 5, wherein the first component is right-hand circularly polarized and the second component is left-hand circularly polarized and the interferometer system further comprises a first analyzer through which the sample portion propagates prior to the first detector.

8. The measurement system according to claim 4, wherein the interferometer system is configured to provide a reflected measurement beam off the front surface having the first frequency and a reflected measurement beam off the back surface having the second frequency to a detector of the detector system and prohibit a reflected measurement beam off the front surface having the second frequency and a reflected measurement beam off the back surface having the first frequency, to reach the detector.

9. The measurement system according to claim 8, wherein the interferometer system is configured to spatially displace the first component relative to the second component prior to impacting the object.

10. The measurement system according to claim 1, further comprising one or more temperature sensors configured to determine a surface temperature profile of the front surface or the back surface or both.

11. The measurement system according to claim 10, wherein the processing system is configured to determine a temperature gradient of the object based on the temperature or the temperature offset at the plurality of locations and the surface temperature profile.

12. The measurement system according to claim 11, wherein the processing system is configured to determine an out-of-plane deformation of the pattern based on the temperature gradient of the object and the mathematical model of the object.

13. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the apparatus further comprises the measurement system according to claim 1.

14. A device manufacturing method comprising transferring a pattern from a patterning device onto a substrate using the lithographic apparatus according to claim 13.

15. The device manufacturing method according to claim 14, wherein transferring the pattern is preceded by:
determining a deformation of the pattern by means of the measurement system of the lithographic apparatus, and
adjusting a setting of the illumination system or projection system of the lithographic apparatus based on the deformation of the pattern.

16. A method comprising:
emitting, to each of a plurality of locations on an object, one or more measurement beams in order to generate, at each of the respective plurality of locations, a reflected measurement beam off a front surface of object and a reflected measurement beam off a back surface of the object;
by a detector system, receiving, for each of the plurality of locations, the respective reflected measurement beams and generating one or more signals representative of the received reflected measurement beams;
determining, based on the plurality of one or more signals, a physical characteristic of the object, the physical characteristic being representative of a deformation of the object; and
determining, based on the physical characteristic of the object and a mathematical model of the object, a deformation of a pattern of the object,
wherein the physical characteristic comprises a temperature or a temperature offset at the plurality of locations.

17. The method according to claim 16, wherein the deformation comprises a local deformation of the object at the plurality of locations.

18. The method according to claim 16, wherein the emitting comprises projecting a measurement beam to the front surface of the object, a first portion of the measurement beam being reflected off the front surface, so as to form the reflected measurement beam off the front surface and a second portion of the measurement beam propagating through the object and at least partially reflecting off the back surface, propagating towards the front surface and at least partially propagates outside the object, so as to form the reflected measurement beam off the back surface.

19. The method according to claim 16, further comprising determining a surface temperature profile of the front surface or the back surface or both using one or more temperature sensors.

20. The method according to claim 16, further comprising adjusting a setting of an illumination system of a lithographic apparatus or of a projection system of the lithographic apparatus, based on the deformation.

* * * * *